United States Patent [19]

Kappeler et al.

[11] Patent Number: 5,070,511

[45] Date of Patent: Dec. 3, 1991

[54] LASER ARRANGEMENT HAVING AT LEAST ONE LASER RESONATOR AND A PASSIVE RESONATOR COUPLED THERETO

[75] Inventors: Franz Kappeler, Puchheim; Thomas Wolf, Munich, both of Fed. Rep. of Germany

[73] Assignee: Siemens Aktiengesellschaft, Munich, Fed. Rep. of Germany

[21] Appl. No.: 477,941
[22] PCT Filed: Oct. 25, 1988
[86] PCT No.: PCT/DE88/00655
§ 371 Date: Jun. 21, 1990
§ 102(e) Date: Jun. 21, 1990
[87] PCT Pub. No.: WO89/04558
PCT Pub. Date: May 18, 1989

[30] Foreign Application Priority Data

Nov. 9, 1987 [DE] Fed. Rep. of Germany ....... 3738053

[51] Int. Cl.$^5$ ................................................ H01S 3/19
[52] U.S. Cl. ........................................ 372/50; 372/92
[58] Field of Search ............................. 372/50, 92, 45

[56] References Cited

U.S. PATENT DOCUMENTS

| 3,747,020 | 7/1973 | Wieder | 372/50 |
| 4,653,058 | 3/1987 | Akiba et al. | 372/50 |
| 4,674,096 | 6/1987 | Salzman et al. | 372/50 |
| 4,773,077 | 9/1988 | Yamamoto et al. | 372/50 |
| 4,869,780 | 9/1989 | Yang et al. | 372/50 |

FOREIGN PATENT DOCUMENTS

| 0010949 | 5/1980 | European Pat. Off. |
| 0158565 | 10/1985 | European Pat. Off. |
| 0206818 | 12/1986 | European Pat. Off. |
| 0213965 | 3/1987 | European Pat. Off. |
| 2538471 | 9/1976 | Fed. Rep. of Germany |
| 130083 | 3/1978 | Fed. Rep. of Germany |
| 55-39612 | 3/1980 | Japan |
| 59-101887 | 6/1984 | Japan |
| 61-42183 | 2/1986 | Japan |
| 61-127190 | 6/1986 | Japan |
| 62-12179 | 1/1987 | Japan |

OTHER PUBLICATIONS

"Monolithic Integration of InGaAsP/InP Semiconductor Lasers Using the Stop-Cleaving Technique", Arsam Antreasyan et al., 8106 IEEE Journal of Quantum Electronics OE-22 (1986) Jul., No. 7, New York, U.S.A. pp. 1064–1072.

"Surface-Emitting GaInAsP/InP Laser with Low Threshold Current & High Efficiency", by Liau et al., Appl. Phys. Lett. 46(2), Jan. 15, 1985, Am. Institute of Physics, pp. 115–117.

"GaAs/GaAlAs Active-Passive-Interference Laser" by H. K. Choi, Electronics Letters, Apr. 14, 1983, vol. 19, No. 8, pp. 302–303.

"Etched-Groove Coupled-Cavity Vapor-Phase-Transported Window Lasers" at 1.55 um, L. A. Coldren et al., Appl. Phys. lett. 46(1), Jan. 1, 1985, American Institute of Physics, pp. 5–7.

"GaInAsP/InP Stripe Lasers with Etched Mirrors Fabricated by a Wet Chemical Etch", B. I. Miller, Appl. Phys. Lett. 37(4), Aug. 15, 1980, American Institute of Physics, pp. 339–341.

"Large Optical Cavity GaAs-(GaAl) As Injection Laser with low-loss distributed Bragg reflectors" by H. Namizaki, et al., Appl. Phys. Lett., vol. 31, No. 2, Jul. 15, 1977, American Institute of Physics, pp. 122–124.

Primary Examiner—Georgia Epps
Attorney, Agent, or Firm—Hill, Van Santen, Steadman & Simpson

[57] ABSTRACT

A laser resonator (11) and a passive resonator (7,22) are coupled longitudinally in such a way as to prevent multiple reflections in the laser (11). The passive resonator (7,22) is, for example, monolithically integrated in laser (11). In a semiconductor wafer (5), a laser-active layer (1) and a waveguide layer (2) transparent to the laser beam are arranged at such a distance apart that no optical coupling occurs through the intermediate semiconductor material. The semiconductor wafer (5) has a cavity (7) perpendicular to the direction of layering and perpendicular to the propagation of the light, with a vertical flank (71) which forms a common reflecting surface of the laser (11) and the passive resonator (7,22) and an inclined flank (72) which reflects the light not coupled to the waveguide layer (22) forming part of the resonator out of the wafer (5).

4 Claims, 2 Drawing Sheets

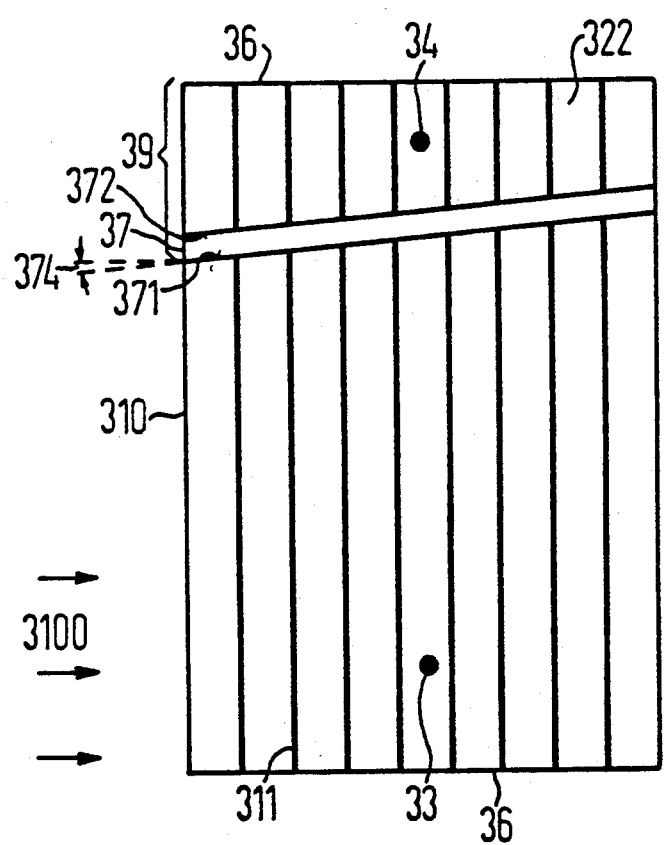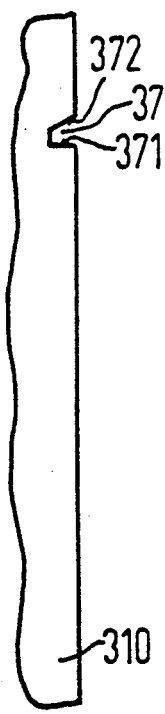

LASER ARRANGEMENT HAVING AT LEAST ONE LASER RESONATOR AND A PASSIVE RESONATOR COUPLED THERETO

BACKGROUND OF THE INVENTION

The invention is directed to a laser arrangement having at least one laser resonator and a passive resonator coupled thereto.

Semiconductor laser arrangements that oscillate in only one mode are known from the literature (see, for example, B. R. Plastow et al, 9th IEEE ISLC, Rio de Janeiro, Aug. 1984, pages 72 ff; Z. L. Liau et al, Appl. Phys. Lett. 46 (1985), pages 115 ff; M. Ohshima et al, 9th IEEE ISLC. Rio de Janeiro, Aug. 1984, pages 188 ff; H. K. Choi et al, Elec. Lett. 19 (1983) pages 302 ff; L. A. Coldren et al, Appl. Phys. Lett. 46 (1985) pages 5 ff). These arrangements contain a plurality of laser-active and laser-passive Fabry-Perot resonators that are longitudinally coupled. The various arrangements differ in terms of their coupling elements. In "cleaved coupled cavity" lasers and "groove-coupled cavity" lasers, an air gap having plane-parallel mirror surfaces is employed as coupling element between two active laser resonators having differing optical length (see, for example, L. A. Coldren et al, Appl. Phys. Lett. Volume 46 (1985), pages 5 ff). In the "active-passive interference" laser, a passive resonator is longitudinally coupled to an active laser resonator via a step in a wave guide structure (see, for example, H. K. Choi and S. Wang, Elec. Lett. Volume 19 (1983) pages 302 ff). In the "internal reflection interference" laser, the coupling ensues via a disturbance of the refractive index that is built into the wave guide (M. Oshima et al, 9th IEEE ISLC, Rio de Janeiro, Aug. 1984, pages 188 ff).

These coupling elements lead to a pronounced and frequency-dependent coupling. Excessive couplings lead to a de stabilization of the operating point of the laser. Great frequency dependency of the coupling leads thereto that abrupt discontinuities of the resonant frequency occur given slight temperature or, respectively, current fluctuations.

SUMMARY OF THE INVENTION

The object of the invention is to specify a further one-mode laser arrangement.

This object is inventively achieved as recited in claim 1. Since multiple reflections between the laser resonator and the passive resonator are present proceeding from the structure, the coupling factor of the arrangement is only slightly dependent on the frequency. This laser arrangement therefore has an improved frequency stability in comparison to the prior art.

The laser arrangement of FIG. 1 has the advantage that the laser resonator and the passive resonator are contained monolithically integrated in a semiconductor layer structure. The adjustment is thereby considerably simplified. The weak coupling required for an optimum frequency stability of the laser arrangement can be reproducibly set in this arrangement on the basis of the angle of inclination of the oblique side wall and on the basis of the width of the trench. Since the passive resonator extends form the vertical side wall of the etched trench up to the end face of the semiconductor layer structure that is situated at the side of the etched trench facing away from the vertical side wall, allowances in the trench width caused by the manufacturing process are not noticed in the operation of the laser arrangement.

The laser arrangement also has the advantage that an attenuation of the laser emission due to optical coupling in transversal direction between the laser-active layer and the transparent wave guide layer is avoided.

As passive resonator, the laser arrangement of FIG. 2 comprises a two-dimensional dielectric disk resonator. Such a disk resonator has a significantly higher quality than a stripe-shaped resonator given identical length.

The laser arrangement of FIGS. 3 and 4 makes it possible to obtain both a longitudinally as well as a laterally one-mode resonant condition.

BRIEF DESCRIPTION OF THE DRAWINGS

Exemplary embodiments of the invention shall be set forth in greater detail below with reference to the figures.

FIG. 3 shows an arrangement that contains a plurality of laterally coupled lasers.

FIG. 4 shows a schematic side view of the arrangement from FIG. 3.

DESCRIPTION OF THE PREFERRED EMBODIMENT

Figure 1:
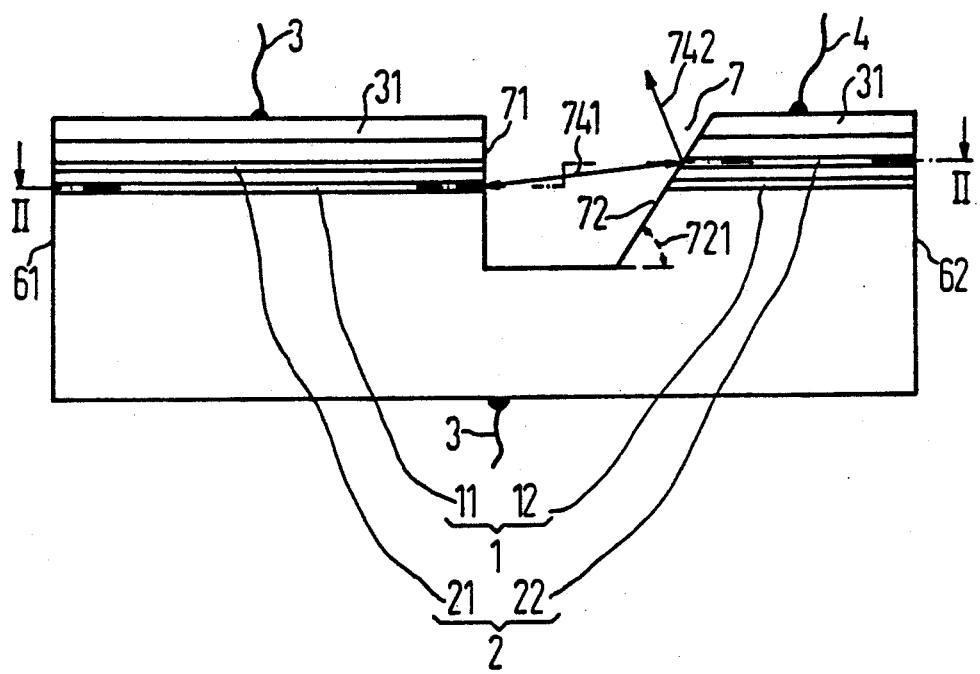
FIG. 1 shows a section through a laser arrangement.

FIG. 1 shows a semiconductor layer structure that contains a laser-active layer 1 and a wave guide layer 2. For example, the semiconductor layer structure is composed of InP/InGaAsp. For example, the laser-active layer 1 is composed of InGaAsP having a band spacing corresponding to a wavelength of 1.3 $\mu$m. The wave guide layer 2 is transparent for laser emission. It is composed, for example, of InGaAsP having a band spacing corresponding to a wavelength of 1.15 $\mu$m. The distance between the laser-active layer 1 and the wave guide layer 2 in the semiconductor layer structure is selected such that no optical coupling occurs through the semiconductor material between the laser-active layer 1 and the wave guide layer 2. The laser-active layer 1 and the wave guide layer 2 have respective thicknesses of approximately 0.1 through 0.3 a $\mu$m. The distance between the laser-active layer 1 and the wave guide layer 2 amounts, for instance, to a few tenths of $\mu$m. The semiconductor layer structure is limited in length by end faces. The end faces are natural cleavage faces and act as mirrors. The end faces contain a left-hand end face 61 and a right-hand end face 62. The semiconductor layer structure comprises a trench 7. The trench 7 proceeds perpendicular to the line that joins the end faces. The trench 7 is so deep that it divides the laser-active layer 1 and the wave guide layer 2 into respectively two parts each. The trench 7 comprises a vertical side wall 71. Further, the trench 7 comprises an oblique side wall 72. The oblique side wall 72 has an angle of inclination 721.

The laser-active layer 1 is divided by the trench 7 into a laser resonator 11 and into a right-hand part of the laser-active layer 12. The wave guide layer 2 is divided by the trench 7 into a left-hand part of the wave guide layer 21 and into a right-hand part of the wave guide layer 22. The vertical side wall 71 acts as mirror for the laser resonator 11. The laser resonator 11 extends between that left-hand end face 61 facing away from the oblique side wall 72 and the vertical side wall 71.

The right-hand part of the wave guide layer 22 extends between the oblique side wall 72 and the right-hand end face 62 that faces toward the oblique side wall 72. The vertical side wall 71 likewise forms a mirror surface for a resonator that is formed by the right-hand part of the wave guide layer 22 and the air gap in the trench 7 between the vertical side wall 71 and the right-hand end face 62.

Light that emerges from the laser resonator 11 into the trench 7 is partially reflected at the oblique side wall 72 (illustrated as an out-coupling arrow 741 in FIG. 1); it is partially coupled into the right-hand part of the wave guide layer 22 (illustrated as a coupling arrow 741 in FIG. 1). The angle of inclination of the oblique side wall 72 is selected such that the back-reflected light cannot proceed into the laser resonator 11. Further, the angle of inclination 721 is selected such that the degree of coupling guarantees a stable operating point of the laser arrangement. It is especially advantageous to select the angle of inclination 721 at a size of 45°.

The oblique side wall 72 also makes it possible to couple laser light out of the laser arrangement perpendicular to the longitudinal extent of the laser resonator 11. The light emerging from the laser resonator 11 is partially reflected in upward direction at the oblique side wall 72 and emerges from the semiconductor layer structure perpendicularly relative to the layer sequence.

For operation of the laser arrangement, the semiconductor layer structure is provided with contacts 3 via a contact layer 31. The contacts 3 are applied at opposite surfaces of the semiconductor layer structure, so that the laser-active layer 1 and the wave guide layer 2 lie between the contacts 3. The contact 3 that is applied to that surface of the semiconductor layer structure in which the trench 7 is also situated is situated above the laser resonator 11. An additional contact 4 is provided in order to compensate potential attenuation losses in the right-hand part of the wave guide layer 22. The additional contact 4 is situated above the right-hand part of the laser-active layer 12 on that surface of the semiconductor layer structure in which the trench 7 is situated.

Figure 2:
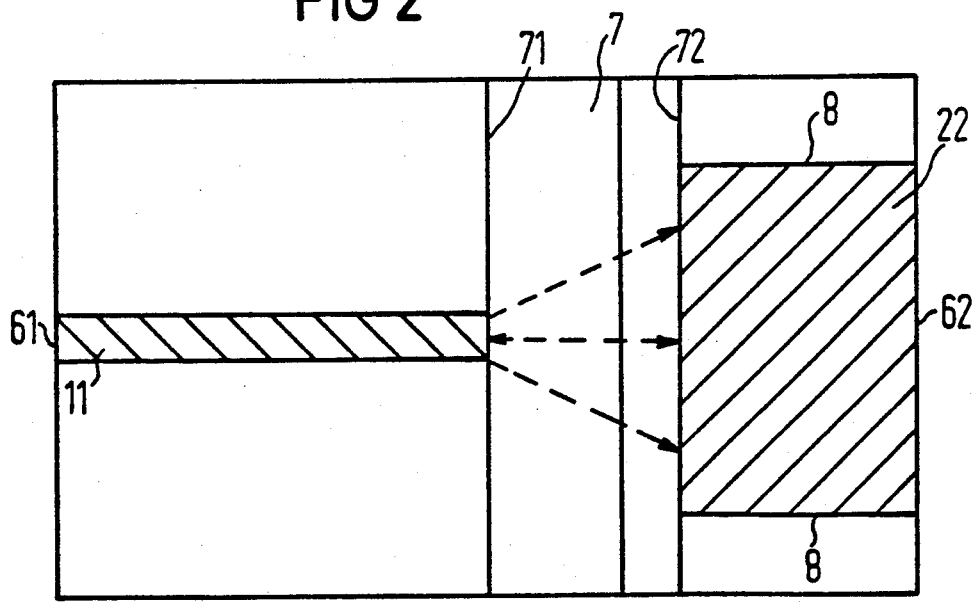
FIG. 2 shows the plan view of the laser arrangement.

FIG. 2 shows the section through the laser arrangement referenced II in FIG. 1. Due to lateral wave guidance, the laser resonator 11 is limited to a stripe. The lateral wave guidance can be achieved on the basis of a standard method such as, for example, gain guidance or index guidance. The right-hand part of the wave guide layer 22 is limited by lateral mirror surfaces 8. The expanse between the lateral mirror surfaces 8 is a multiple larger than the width of the stripe-shaped laser resonator 11. The lateral mirror surfaces 8 are acquired, for example, by etching.

The light coupled into the right-hand part of the wave guide layer 22 propagates both in longitudinal as well as in lateral direction and is reflected at the right-hand end face 62 that is a natural cleavage face and at the two lateral mirror surfaces 8. As a result thereof, the right-hand part of the wave guide layer 22 and the air gap of the trench 7 up to the vertical side wall 71 between the lateral mirror surfaces 8 act as a two-dimensional, dielectric disk resonator (see FIG. 2). Given identical lengths, the quality of a disk resonator is significantly higher than that of a stripe-shaped resonator. This laser arrangement therefore has a lower frequency noise and also thus has a smaller line width than laser arrangements having stripe-shaped resonators.

Since the region between the vertical side wall 71 and the right-hand end face 62 acts as resonator, allowances in the width of the trench 7 caused by the manufacturing process are not felt.

FIG. 3 shows a further exemplary embodiment of the invention. In this exemplary embodiment, a plurality of stripe lasers 311, for example eight stripe lasers 311 are integrated in a semiconductor body 310. The stripe lasers 311 are constructed analogous to the laser resonator 11 in the first exemplary embodiment in FIG. 1 and in FIG. 1. The stripe lasers 311 are laterally coupled to one another. In longitudinal direction, the stripe lasers 311 are coupled to resonators 39. The resonators 39 are composed of a wave guide part 322 and of the air gap of a trench 37. A vertical side wall 371 of the trench 37 and a end face 36 of the semiconductor body 310 that is situated at that side of the trench 37 facing away from the strip lasers 311 act as resonator mirror. The trench 37 is etched analogous to the trench 7 of the first exemplary embodiment. In addition to the vertical side wall 371, it comprises a oblique side wall 372. The trench 37 proceeds transversely relative to the stripe lasers 311, whereby the trench 37 describes an angle 374 of 0° through 20° with the perpendicular relative to the longitudinal direction of the stripe lasers 311. Due to this oblique course of the trench 37, all stripe lasers 311 have a somewhat different length relationship to the respective resonator 39. An additional frequency selection in longitudinal direction is thereby realized. It is thereby possible to select the lateral supermodes of the arrangement and to thus obtain both a longitudinally as well as a laterally one-mode resonant condition.

Further contacts 33 are provided for the operation of the laser arrangement. They are applied such to the semiconductor body 310 analogous to the contacts 3 in FIG. 1 that the stripe lasers lie therebelow. A further, additional contact 34 is provided in order to compensate potential attenuation losses (see FIG. 3).

FIG. 4 shows a schematic side view of the laser arrangement of FIG. 3. The side view refers to the direction that is indicated by arrows 3100 in FIG. 3. The trench 37 is etched into the surface of the semiconductor body 310. The side view is intended to illustrate the etching profile of the trench 37 having the vertical side wall 371 and the oblique side wall 372.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

We claim:

1. In a laser arrangement having at least one laser resonator and one passive resonator coupled thereto in a longitudinal direction that are monolithically integrated in a semiconductor layer structure, having:
   an active layer for the laser resonator, a wave guide layer for the passive resonator, a trench that has a vertical side wall perpendicular oriented relative to the active layer and an oblique side wall inclined by an angle of inclination relative to the wave guide layer,
whereby the perpendicular side wall forms a mirror surface between the laser resonator and the passive resonator and the oblique side wall cuts the passive resonator, comprising:
   the active layer and the wave guide layer arranged above one another;

the spacing between the active layer and the wave guide layer being such that no optical coupling through semiconductor material ensues between the active layer and the wave guide layer;

the angle of inclination of the oblique side wall dimensioned such that the radiation emerging from the active layer at the vertical side wall is not reflected back into the active layer; and a width of the trench and the angle of inclination dimensioned relative to one another such that radiation from the active layer is coupled into a part of the wave guide layer located in the passive resonator.

2. The laser arrangement according to claim 1, wherein the passive resonator is provided with a contact.

3. The laser arrangement according to claim 1, wherein the passive resonator is a two-dimensional dielectric disk resonator;

the part of the wave guide layer located in the passive resonator being laterally limited by respective lateral mirror surfaces;

the lateral mirror surfaces being at a distance from one another that exceeds the width of the laser resonator by a multiple; and the trench extending perpendicularly relative to the longitudinal direction of the laser resonator.

4. The laser arrangement according to claim 1, wherein a plurality of laterally coupled stripe lasers are in the active layer;

these stripe lasers each having a respective passive resonator allocated to them;

the stripe lasers and the passive resonators at a side lying respectively opposite the vertical side wall of the trench respectively limited by an end face arranged perpendicularly relative to longitudinal direction of the stripe laser; and the trench extending at an angle of less than 90° and of at least 70° relative to the longitudinal direction of these stripe lasers, so that the ratio of the length of a stripe laser to the length of the passive resonator allocated thereto varies from one stripe laser to the next.

* * * * *